(12) United States Patent　　(10) Patent No.:　US 12,637,754 B2
　Luo　　　　　　　　　　　　　　(45) Date of Patent:　May 26, 2026

(54) OXIDE FILM PREPARATION METHOD

(71) Applicant: BEIJING NAURA MICROELECTRONICS EQUIPMENT CO., LTD., Beijing (CN)

(72) Inventor: Jianheng Luo, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 428 days.

(21) Appl. No.: 18/250,541

(22) PCT Filed: Oct. 21, 2021

(86) PCT No.: PCT/CN2021/125198
§ 371 (c)(1),
(2) Date: Apr. 26, 2023

(87) PCT Pub. No.: WO2022/089288
PCT Pub. Date: May 5, 2022

(65) Prior Publication Data
US 2023/0399734 A1　　Dec. 14, 2023

(30) Foreign Application Priority Data
Oct. 26, 2020　(CN) .......................... 202011157653.2

(51) Int. Cl.
C23C 14/06　　　(2006.01)
C23C 14/00　　　(2006.01)
(Continued)

(52) U.S. Cl.
CPC ...... C23C 14/0676 (2013.01); C23C 14/0063 (2013.01); C23C 14/081 (2013.01);
(Continued)

(58) Field of Classification Search
CPC ............ C23C 14/0676; C23C 14/0063; C23C 14/081; C23C 14/083; C23C 14/3485;
(Continued)

(56) References Cited

U.S. PATENT DOCUMENTS 5,322,605 A * 6/1994 Yamanishi .......... C23C 14/0063
204/298.07
6,013,553 A 1/2000 Wallace et al.
(Continued)

FOREIGN PATENT DOCUMENTS

CN　　102084470 A　　6/2011
CN　　107513692 A　　12/2017
(Continued)

OTHER PUBLICATIONS

The World Intellectual Property Organization (WIPO) International Search Report for PCT/CN2021/125198 Jan. 20, 2022 10 Pages (including translation).
(Continued)

*Primary Examiner* — Patrick S Ott
(74) *Attorney, Agent, or Firm* — Anova Law Group, PLLC

(57)　　　　ABSTRACT

The oxide film preparation method includes placing a wafer in a reaction chamber, introducing a first mixed gas of a bombardment gas and an oxidization gas into the reaction chamber, applying DC power and radio frequency (RF) power to the target, exciting the first mixed gas to form a plasma to bombard the target to form an oxide film on the wafer, stopping applying the DC power and the RF power on the target, introducing a second mixed gas of the bombardment gas, the oxidization gas, and nitrogen into the reaction chamber, applying the RF power to the base, exciting the second mixed gas to form the plasma to bombard the oxide film to form an oxynitride film, continuing to introduce the
(Continued)

Place a wafer that is to be deposited with a film on a base of a reaction chamber — Step 1

Introduce a first mixed gas of a bombardment gas and an oxidization gas into the reaction chamber, apply DC power and radio frequency (RF) power to a target, and excite the first mixed gas to form a plasma to bombard the target to form an oxide film on the wafer — Step 2

Stop applying the DC power and the RF power to the target, introduce a second mixed gas of the bombardment gas, the oxidization gas, and nitrogen into the reaction chamber, apply the RF power to the base, and excite the second mixed gas to form a plasma to bombard the oxide film to form an oxynitride film — Step 3

Continue to introduce the second mixed gas into the reaction chamber, apply the DC power and the RF power to the target, continue to apply the RF power to the base, and excite the second mixed gas to form a plasma to bombard the target and the above oxynitride film formed in step 3 to form an oxynitride film on the oxynitride film formed in step 3 — Step 4 second mixed gas, exciting the second mixed gas to form the plasma to bombard the target and the oxynitride film to form an oxynitride film.

10 Claims, 2 Drawing Sheets

(51) Int. Cl.

| | | |
|---|---|---|
| *C23C 14/08* | (2006.01) | |
| *C23C 14/34* | (2006.01) | |
| *H10P 14/60* | (2026.01) | |

(52) U.S. Cl.
CPC ........ *C23C 14/083* (2013.01); *C23C 14/3485* (2013.01); *H10P 14/6329* (2026.01)

(58) Field of Classification Search
CPC ............ C23C 14/0036; C23C 14/3471; C23C 14/3492; C23C 14/54; C23C 14/5826; C23C 14/5873; C23C 28/04; C23C 14/10; C23C 14/3414; H01L 21/02266; H01L 21/02164; H01L 21/02332; H01L 21/02351; H01L 21/02178; H01L 21/022; H01J 37/32082; H01J 37/3405; H01J 37/3426; Y02P 70/50
See application file for complete search history.

(56) References Cited

U.S. PATENT DOCUMENTS

| | | | | |
|---|---|---|---|---|
| 6,110,842 A | * | 8/2000 | Okuno ................. | H10D 64/693 |
| | | | | 438/770 |
| 6,468,921 B1 | | 10/2002 | Shih et al. | |
| 2004/0021177 A1 | | 2/2004 | Akimoto et al. | |
| 2005/0145479 A1 | * | 7/2005 | Karlsson ................. | C23C 14/35 |
| | | | | 204/192.15 |
| 2005/0153570 A1 | | 7/2005 | Matsuyama et al. | |
| 2009/0014809 A1 | * | 1/2009 | Sekine ............. | H01L 21/28097 |
| | | | | 257/369 |
| 2009/0229969 A1 | * | 9/2009 | Hoffman ........... | H01J 37/32715 |
| | | | | 204/192.12 |
| 2010/0295811 A1 | * | 11/2010 | Takahashi ............... | G06F 3/045 |
| | | | | 345/173 |
| 2014/0252503 A1 | * | 9/2014 | Chudzik ............. | H01L 21/0234 |
| | | | | 257/411 |
| 2015/0179459 A1 | | 6/2015 | Chudzik et al. | |
| 2015/0252467 A1 | * | 9/2015 | Allen .................. | H01L 21/0338 |
| | | | | 204/192.12 |
| 2016/0240483 A1 | * | 8/2016 | Cheng ................. | C23C 14/0676 |
| 2020/0111659 A1 | | 4/2020 | Liu et al. | |
| 2020/0350160 A1 | * | 11/2020 | Zhou ................. | H01L 21/67745 |

FOREIGN PATENT DOCUMENTS

| | | |
|---|---|---|
| CN | 110218984 A | 9/2019 |
| CN | 112376024 A | 2/2021 |
| JP | H0313573 A | 1/1991 |
| WO | 2014082554 A1 | 6/2014 |

OTHER PUBLICATIONS

The European Patent Office (EPO) The Extended European Search Report for Application No. 21885015.4, Nov. 4, 2024 9 Pages.

\* cited by examiner

1

OXIDE FILM PREPARATION METHOD

CROSS-REFERENCE TO RELATED APPLICATIONS

This application is a national phase entry under 35 U.S.C. § 371 of International Application No. PCT/CN2021/125198, filed on Oct. 21, 2021, which claims priority to Chinese Application No. 202011157653.2 filed on Oct. 26, 2020, the entire contents of both of which are incorporated herein by reference.

TECHNICAL FIELD

The present disclosure generally relates to the semiconductor process field and, more particularly, to an oxide film preparation method.

BACKGROUND

In recent years, with the rapid development of ultra-large-scale integrated circuit technology, a feature size of a device is constantly decreasing, and a device density is increasing. RC delay caused by metalized interconnection has become a key reason for blocking the performance and speed of the ultra-high-intensity integrated circuit. Therefore, reducing the RC interconnection delay has become a main direction of the semiconductor industry in recent years. In an integrated circuit fabrication process, a metal line is usually embedded in an interlayer dielectric (ILD) layer with a low dielectric constant. In a Damascus process, an etching stop layer is usually deposited on the interlayer dielectric layer and the metal line. The etching stop layer is used to protect a material covered by the etching stop layer from being etched during a patterning process of the integrated circuit fabrication process. The etching stop layer is usually not completely removed and remains in the fabricated semiconductor device.

Aluminum oxide is increasingly used as the etching stop layer due to the good process compatibility of the aluminum oxide. A commonly used method for preparing an aluminum oxide film is a chemical vapor deposition (hereinafter referred to as CVD) method. However, the film prepared by the CVD method has many impurities and low density, and the process cost is high. Another method includes a pulsed magnetron sputtering method, which is a physical vapor deposition (hereinafter referred to as PVD) method. The aluminum oxide film prepared by the PVD method has good film uniformity, fewer impurities, and high density. The PVD method is one of the most commonly used methods in an integrated circuit metallization process. However, when a non-conductive oxide film is prepared using the traditional PVD method, problems such as a small process window, a low deposition rate, uneven etching, particle defects caused by frequent abnormal arc discharge, etc., can exist. These problems bring great difficulty to subsequent process integration. Therefore, it is desired to find a new oxide film preparation method.

SUMMARY

The purpose of the present disclosure is to provide an oxide film preparation method to solve problems of low deposition rate, particle defects, large surface roughness, and low film density. The preparation method includes:

step 1, placing a wafer that is to be deposited with a film on a base of a reaction chamber;

step 2, introducing a first mixed gas of a bombardment gas and an oxidization gas into the reaction chamber, applying DC power and radio frequency (RF) power to a target, and exciting the first mixed gas to form a plasma to bombard the target to form an oxide film on the wafer;

step 3, stopping applying the DC power and the RF power to the target, introducing a second mixed gas of a bombardment gas, an oxidization gas, and nitrogen into the reaction chamber, applying the RF power to the base, and exciting the second mixed gas to form a plasma to bombard the oxide film to form an oxynitride film; and step 4, continuing to introduce the second mixed gas into the reaction chamber, applying the DC power and the RF power to the target, continuing to apply the RF power to the base, and exciting the second mixed gas to form the plasma to bombard the target and the oxynitride film formed in step 3 to form an oxynitride film on the oxynitride film formed in step 3.

In some embodiments, in step 2, the DC power applied to the target is less than 10000 W, and the RF power applied to the target is less than 3000 W, and a ratio of the RF power applied to the target to the DC power applied to the target is greater than or equal to 2 and less than or equal to 4.

In some embodiments, in the step 2, the DC power applied to the target is greater than or equal to 100 W and less than or equal to 200 W, the RF power applied to the target is greater than or equal to 300 W and less than or equal to 600 W, and the ratio of the RF power applied to the target to the DC power applied to the target is 3.

In some embodiments, in step 4, the DC power applied to the target is less than 10000 W, and the RF power applied to the target is less than 3000 W, and a ratio of the DC power applied to the target to the RF power applied to the target is greater than or equal to 2 and less than or equal to 7.

In some embodiments, in step 4, the DC power applied to the target is greater than or equal to 3000 W and less than or equal to 6000 W, and the RF power applied to the target is greater than or equal to 1000 W and less than or equal to 2000 W, and the ratio of the DC power applied to the target to the RF power applied to the target is greater than or equal to 3 and less than or equal to 6.

In some embodiments, in step 3 and/or step 4, a sum of a flow rate of the oxidization gas and a flow rate of the nitrogen is greater than a flow rate of the bombardment gas.

In some embodiments, in step 3 and/or step 4, the RF power applied to the base is less than 500 W.

In some embodiments, a process condition in step 1 includes that a vacuum degree of the reaction chamber is less than $5 \times 10^{-6}$ Torr, and a temperature of the base is greater than or equal to 250° C. and less than or equal to 350° C.

In some embodiments, in step 2 and/or step 3, a flow rate of the bombardment gas is less than 500 sccm, and a flow rate of the oxidization gas is less than 500 sccm, and the flow rate of the bombardment gas is greater than the flow rate of the oxidization gas.

In some embodiments, wherein the target includes aluminum, titanium, silicon, hafnium, or tantalum target, or a compound target including aluminum, titanium, silicon, hafnium, or tantalum.

The present disclosure includes the following beneficial effects.

In step 2, the DC power and RF power are simultaneously applied to the target, which can reduce the generation of the particle defects in the oxide deposition process. In step 3, the second mixed gas of the bombardment gas, the oxidization gas, and the nitrogen is introduced, and the RF power is applied to the base. Thus, the oxynitride film is formed in situ, and the etching is performed on the surface of the oxide film to a certain degree. Thus, the surface defects of the oxide film can be reduced, and the surface roughness can be reduced. In step 4, the above second mixed gas is continuously introduced, and the DC power and RF power are applied to the target simultaneously, and the RF power is applied to the base. Thus, the oxynitride film with high density and low roughness can be deposited on the surface of the wafer. Therefore, the quality of the film can be improved. The high-quality surface of the film can also be used to prevent the transition layer from being formed between the etching layer and the metal layer. Thus, the oxidation of the metal layer can be reduced.

The method of the present disclosure can have other features and advantages, which are apparent from the accompanying drawings of the present disclosure and the subsequent specific embodiments or will be described in the accompanying drawings of the present disclosure and the subsequent embodiments. These accompanying drawings and the specific embodiments are together used to describe a specific principle of the present disclosure.

BRIEF DESCRIPTION OF THE DRAWINGS

Embodiments of the present disclosure are described in more detail in connection with the accompanying drawings. The above and other purposes, features, and advantages of the present disclosure become more obvious.

DETAILED DESCRIPTION OF THE EMBODIMENTS

The present disclosure is described in more detail below. Although the present disclosure provides preferred embodiments, it should be understood that the present disclosure can be implemented in various forms and should not be limited by embodiments of the present disclosure. On the contrary, providing these embodiments is to make the present disclosure more thorough and complete and to convey the scope of the present disclosure completely to those skilled in the art.

Figure 1:
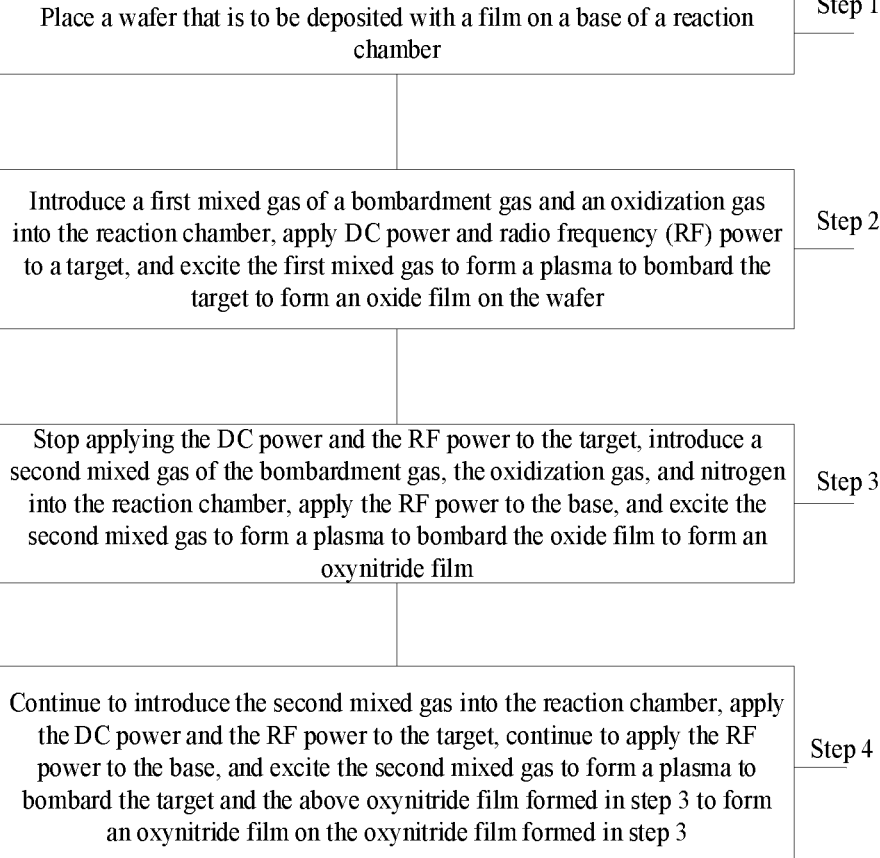
FIG. 1 illustrates a schematic flowchart of an oxide film preparation method according to an embodiment of the present disclosure.

An embodiment of the present disclosure provides an oxide film preparation method. FIG. 1 illustrates a schematic flowchart of the oxide film preparation method according to an embodiment of the present disclosure. As shown in FIG. 1, the oxide film preparation method includes the following steps.

In step 1, a to-be-deposited wafer is placed on a base of a reaction chamber.

In step 2, a first mixed gas of a bombardment gas and an oxidization gas is introduced into the reaction chamber, DC power and radio frequency (RF) power are applied to a target, and the first mixed gas is excited to form a plasma to bombard the target to form an oxide film on the wafer.

In step 3, the DC power and the RF power are stopped to be applied to the target, a second mixed gas of the bombardment gas, the oxidization gas, and nitrogen is introduced into the reaction chamber, the RF power is applied to the base, and the second mixed gas is excited to form a plasma to bombard the oxide film to form an oxynitride film.

In step 4, the second mixed gas is continued to be introduced into the reaction chamber, the DC power and the RF power are applied to the target, the RF power is continued to be applied to the base, and the second mixed gas is excited to form a plasma to bombard the target and the above oxynitride film formed in step 3 to form an oxynitride film on the oxynitride film formed in step 3.

To facilitate the understanding of the solution, an apparatus configured to prepare a film can be introduced briefly. The film preparation can be performed in a reaction chamber. The reaction chamber includes a base configured to carry a wafer that is to be deposited with the film. The base can have a heating and/or cooling function to control the temperature of the wafer. The reaction chamber can be connected to a vacuum system. The vacuum system can evacuate the reaction chamber to cause the reaction chamber to reach a required vacuum degree to meet a vacuum condition required by the process. Gases required for the process (such as bombardment gas, oxidization gas, etc.) can be introduced into the reaction chamber through an inlet pipeline. A flow meter can be arranged on the inlet pipeline to control the flow of the gas. The target required for the process can be sealed in an upper area of the reaction chamber (above the base). The above target can be pure metal or metal compound, or silicon or silicon dioxide (when silicon oxide needs to be deposited). During film deposition, the power supply can apply power to the target to make the target have a negatively biased voltage relative to the grounded reaction chamber. In addition, the high voltage can cause the bombardment gas and oxidization gas to ionize and discharge to generate a positively charged plasma. The positively charged plasma can be attracted by the target and bombard the target. When the energy of the plasma is high enough, atoms on the surface of the target can escape and be deposited on the wafer to deposit a film on the surface of the wafer.

In some embodiments, the oxide film preparation method can be described in detail by taking the deposition of a composite film of aluminum oxide and aluminum oxynitride on the surface of the wafer as an example.

In some embodiments, step 1 can be performed. According to different films to be deposited, a suitable process condition can be set for the reaction chamber. The wafer that is to be deposited with films can be placed on the base of the reaction chamber. The temperature of the base can be adjusted to the temperature required by the process. In some embodiments, the preparation method can be used to deposit an aluminum oxide film. Thus, the set process condition can include that a vacuum degree of the reaction chamber is less than $5\times10^{-6}$ Torr, the temperature of the base is greater than or equal to 250° C. and less than or equal to 350° C., preferably, e.g., 300° C.

Step 2 can be performed. The first mixed gas of the bombardment gas and the oxidization gas is introduced into the reaction chamber. The DC power and the RF power can be applied to the target to excite the first mixed gas to form a plasma to bombard the target to form an oxide film on the wafer.

In the existing technology, only pulsed DC power can be applied to the target. The aluminum oxide film is a non-conductive oxide. The pulsed DC power can have two stages of positive voltage and negative voltage in one cycle. In the negative voltage stage, the DC power supply can apply the negative voltage. Then, the plasma can bombard the target to sputter the target. In the positive voltage stage, the DC power supply can apply the positive voltage on the target. Thus, electrons can be introduced to the target to neutralize the positive charges accumulated on the surface of the target. The loading method of this pulsed DC power can lead to problems such as low deposition rate, uneven etching, particle defects caused by frequent abnormal arc discharge, the large surface roughness of the film, low film density, and surface defects formed by easy adsorption of impurity gases such as water, oxygen, and carbon, which causes great difficulty in the subsequent process integration.

To solve the above problems, in step 2 of embodiments of the present disclosure, the DC power and the RF power can be simultaneously applied to the target. The RF/DC co-sputtering power loading method can form a negative voltage on the target to promote the plasma to bombard the target to realize the sputtering of the target. The RF/DC co-sputtering power loading method can be further used to reduce ion energy and avoid damage to the interlayer dielectric (ILD) film at the bottom of the wafer to form a high-density aluminum oxide film (e.g., as a contact layer). In addition, the particle defects can also be reduced during the deposition of the metal oxides. Meanwhile, in the process of depositing the nitrogen oxide film, the adsorption of water, oxygen, and carbon in the air can be prohibited on the surface of the metal oxide to generate particle defects. In addition, by increasing the RF power on the target, the collision and ionization of the oxygen in the plasma can be increased, and the distribution of the oxygen atoms can be changed. Thus, the uniformity of the wet etching of the oxide film can be improved.

Step 3 can be performed to stop applying the DC power and RF power to the target. The second mixed gas of the bombardment gas, the oxidization gas, and the nitrogen can be introduced into the reaction chamber. The RF power can be applied to the base to excite the second mixed gas to form the plasma to bombard the oxide film to form the oxynitride film.

In the step, by applying the RF power to the base, a negatively biased voltage can be formed on the base to attract the plasma to bombard the surface of the film to achieve the purpose of processing the surface of the oxide film formed in step 2. The surface processing can be used to form the oxynitride film in situ. That is, a relatively thin oxynitride film can be formed on the surface of the oxide film to reduce the surface defects of the oxide film. Meanwhile, the above surface processing can also be used to perform certain etching on the surface of the formed oxide film to reduce the surface roughness of the film.

Step 4 can be performed to continue to introduce the above second mixed gas into the reaction chamber. The DC power and RF power can be applied to the target. The RF power can be continued to be applied to the base to excite the second mixed gas to form the plasma to bombard the target and the above oxynitride film formed in step 3 to form an oxynitride film on the oxynitride film (or oxide film) formed in step 3.

In the step, the DC power and RF power can be simultaneously applied to the target, and the RF power can be applied to the base. Thus, etching and deposition can be performed simultaneously on the film. The deposition rate can be greater than the etching rate to deposit a film with the high density and low roughness on the surface of the wafer to improve the film quality. In addition, the film surface with high quality can also be used to prevent a transition layer from being formed between the etching layer and the metal layer. Thus, the oxidation of the metal layer can be reduced.

In some embodiments, in step 2, the bombardment gas can include, for example, argon, and the oxidization gas can include, for example, oxygen.

In some embodiments, in step 2, a process pressure of the reaction chamber can be maintained at greater than or equal to 3 mTorr and less than or equal to 10 mTorr.

In some embodiments, in step 2, the flow rate of the bombardment gas can be less than 500 sccm. In a preferred embodiment, the flow rate of the bombardment gas can be greater than or equal to 50 sccm and less than or equal to 200 sccm. The flow rate of the oxidization gas can be less than 500 sccm. In a preferred embodiment, the flow rate of the oxidization gas can be greater than or equal to 20 sccm and less than or equal to 100 sccm. The flow rate of the bombardment gas can be greater than the flow rate of the oxidization gas. That is, a ratio of the bombardment gas to the oxidization gas can be greater than 1. Thus, the ratio can be very different from the existing technology (a ratio of bombardment gas to oxidization gas is less than 0.5). That is, in embodiments of the present disclosure, a proportion of the oxidization gas can be reduced compared to the existing technology, which can avoid the proportion of the oxidization gas from being too high. The oxidization gas with a high proportion cannot be beneficial to control the particle defects and the etching uniformity. The particle defects can be reduced during the metal oxide deposition process. Meanwhile, the particle defects generated by absorbing the water, oxygen, and carbon in the air on the surface of the metal oxide can be prohibited during the oxynitride film deposition process.

In some embodiments, in step 2, the DC power applied to the target can be less than 10000 W. In a preferred embodiment, the DC power can be greater than or equal to 100 W and less than or equal to 200 W. The RF power applied to the target can be less than 3000 W. In a preferred embodiment, the RF power can be greater than or equal to 300 W and less than or equal to 600 W. A ratio of the RF power applied to the target to the DC power applied to the target can be greater than or equal to 2 and less than or equal to 4. In a preferred embodiment, the ratio can be 3. By setting the above ratio within the value range, the ionization and collision of aluminum and oxygen atoms can be increased in high-density plasma when the aluminum oxide film is deposited. The lateral migration of the film can be changed when the film grows on the substrate surface. Thus, the film with low damage and high density can be formed to avoid damage to the interlayer dielectric layer with the low dielectric constant at the bottom layer to change the dielectric constant of the material.

In some embodiments, in step 3, the bombardment gas can include, for example, argon, and the oxidization gas can include, for example, oxygen. Nitrogen can be used to bombard the surface of the formed oxide film to a certain degree after ionization.

In some embodiments, in step 3, the process pressure of the reaction chamber can be maintained at greater than or equal to 3 mTorr and less than or equal to 10 mTorr.

In some embodiments, in step 3, the flow rate of the bombardment gas can be less than 500 sccm. In a preferred embodiment, a range of the flow rate of the bombardment gas can be greater than or equal to 50 sccm and less than or equal to 200 sccm. The flow rate of the oxidization gas can be less than 500 sccm. In a preferred embodiment, the flow rate of the oxidization gas can be greater than or equal to 20 sccm and less than or equal to 100 sccm. A sum of the flow rates of the oxidization gas and the nitrogen can be greater than the flow rate of the bombardment gas. That is, a ratio of the sum of the flow rates of the oxidization gas and the nitrogen to the flow rate of the bombardment gas can be greater than 1. Thus, it is beneficial for performing etching on the formed oxide film surface to a certain degree to reduce the surface roughness of the film.

In some embodiments, in step 3, the RF power applied to the base can be less than 500 W. In a preferred embodiment, the range of the RF power applied to the base can be greater than or equal to 50 W and less than or equal to 100 W.

In some embodiments, in step 4, the process pressure of the reaction chamber can be maintained at greater than or equal to 3 mTorr and less than or equal to 10 mTorr.

In some embodiments, in step 4, the flow rate of the bombardment gas can be less than 500 sccm. In a preferred embodiment, the flow rate of the bombardment gas can be greater than or equal to 50 sccm and less than or equal to 200 sccm. The flow rate of the oxidization gas can be less than 500 sccm. In a preferred embodiment, the flow rate of the oxidization gas can be greater than or equal to 20 sccm and less than or equal to 100 sccm. The flow rate of the bombardment gas can be greater than the flow rate of the oxidization gas. That is, the ratio of the bombardment gas to the oxidization gas can be greater than 1.

In some embodiments, in step 4, the DC power applied to the target can be less than 10000 W. In a preferred embodiment, the DC power can be greater than or equal to 3000 W and less than or equal to 6000 W. The RF power applied to the target can be less than 3000 W. In a preferred embodiment, the RF power applied to the target can be greater than or equal to 1000 W and less than or equal to 2000 W. The ratio of the DC power applied to the target to the RF power applied to the target can be greater than or equal to 2 and less than or equal to 7. In some embodiments, the ratio can be greater than or equal to 3 and less than or equal to 6, such as 3, 5, 6, etc. With the setting of the ratio, it is beneficial to deposit the film with high density and low roughness on the surface of the wafer to improve the quality of the film. Moreover, the film surface with high quality can be used to prevent the transition layer from being formed between the etching layer and the metal layer to reduce the oxidization of the metal layer.

In some embodiments, in step 4, the RF power applied to the base can be less than 500 W. In a preferred embodiment, the RF power applied to the base can be greater than or equal to 50 W and less than or equal to 200 W.

Figure 2:
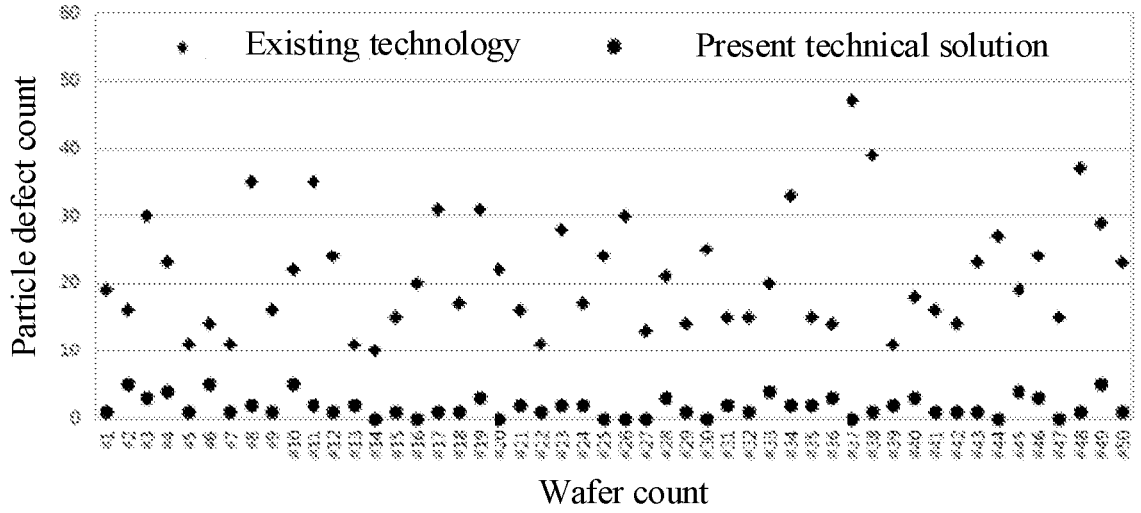
FIG. 2 illustrates a schematic diagram showing a comparison between a number of particle defects of an oxide film processed according to an embodiment of the present disclosure and a number of particle defects of an oxide film processed according to the existing technology.
Figure 3:
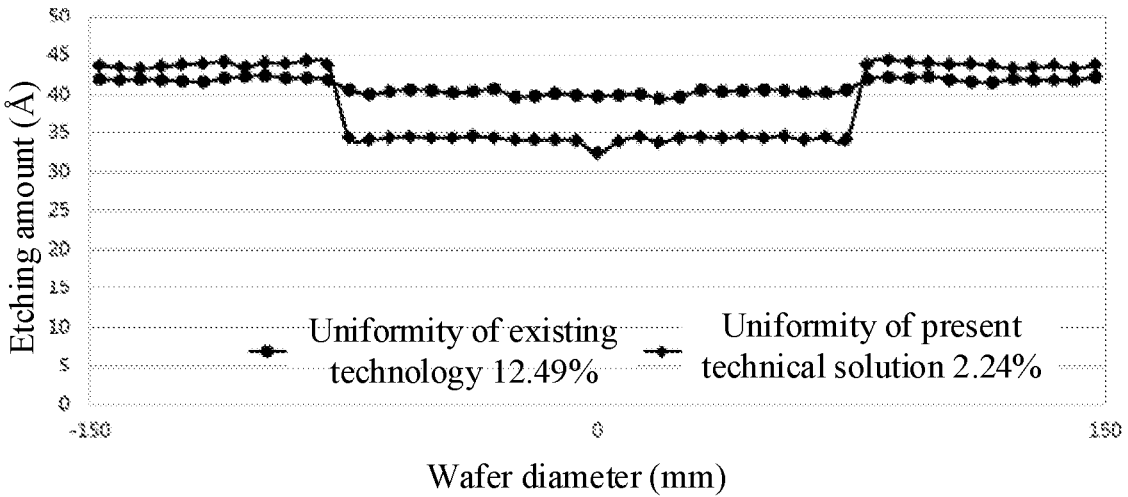
FIG. 3 illustrates a schematic diagram showing a comparison between an etching uniformity of an oxide film processed according to an embodiment of the present disclosure and an etching uniformity of an oxide film processed according to the existing technology.

FIG. 2 illustrates a schematic diagram showing a comparison between a number of particle defects of an oxide film processed according to an embodiment of the present disclosure and a number of particle defects of an oxide film processed according to the existing technology. FIG. 3 illustrates a schematic diagram showing a comparison between an etching uniformity of an oxide film processed according to an embodiment of the present disclosure and an etching uniformity of an oxide film processed according to the existing technology. As shown in FIG. 2 and FIG. 3, the particle defects are obviously reduced in the present technical solution compared to the existing technology. A number of particles larger than 30 nm can be less than 5 on the upper film of the wafer. Meanwhile, the uniformity of the wet etching is greatly improved. The uniformity is reduced from 12.49% to 2.24%.

The above description takes the formation of aluminum oxide and oxynitride films as an example. It should be understood that the method of the present disclosure can be also used to prepare other films, such as a composite film of titanium, silicon, hafnium, or tantalum oxides and oxynitrides.

In summary, in the oxide film preparation method of embodiments of the present disclosure, in step 2, the DC power and the RF power can be simultaneously applied to the target, which can reduce the particle defects during the oxide deposition process. In step 3, the second mixed gas of the bombardment gas, the oxidization gas, and the nitrogen can be introduced, and the RF power can be applied to the base. The oxynitride film can be formed in situ, and the surface of the oxide film can be etched to a certain degree. Thus, the surface defects of the oxide film can be reduced, and the surface roughness can be reduced. In step 4, the above second mixed gas can be continuously introduced. The DC power and RF power can be simultaneously applied to the target. The RF power can be applied to the base. Thus, the oxynitride film with high density and low roughness can be formed and deposited on the surface of the wafer to improve the film quality. Moreover, the surface of the film with high quality can also be used to prevent the transition layer from being formed between the etching layer and the metal layer to reduce the oxidation of the metal layer. In addition, in the oxide film preparation method of embodiments of the present disclosure, control methods of the ion energy and distribution can be increased during the film growing process, and the process window can be enlarged, which provides an effective method for preparing an oxide film with a high density.

Various embodiments of the present disclosure have been described above. The above description is exemplary, not exhaustive, and not limited to the disclosed embodiments. Modifications and variations are apparent to those of ordinary skill in the art without departing from the scope and spirit of embodiments of the present disclosure.

What is claimed is:

1. An oxide film preparation method comprising:
placing a wafer on a base of a reaction chamber; and
sequentially forming an oxide film on the wafer, a first oxynitride film on the oxide film, and a second oxynitride film on the first oxynitride film by following processes:
performing a first process after placing the wafer on the base, the first process including introducing a first mixed gas of a first bombardment gas and a first oxidization gas into the reaction chamber, applying first DC power and first radio frequency (RF) power to a target, and exciting the first mixed gas to form a first plasma to bombard the target to form the oxide film on the wafer;
performing a second process after performing the first process, the second process including introducing a second mixed gas of a second bombardment gas, a second oxidization gas, and first nitrogen into the reaction chamber, applying second RF power to the base, and exciting the second mixed gas to form a second plasma to bombard the oxide film to form the first oxynitride film by reacting with a surface of the oxide film; and
performing a third process after performing the second process, the third process including introducing a third mixed gas of a third bombardment gas, a third oxidization gas, and second nitrogen into the reaction chamber, applying second DC power and third RF power to the target, applying fourth RF power to the base, and exciting the third mixed gas to form a third plasma to bombard the target and the first oxynitride film formed on the oxide film to form the second oxynitride film on the first oxynitride film that is arranged on the oxide film.

2. The method according to claim 1, wherein:

the first RF power applied to the target is less than 3000 W; and when the first process is performed, a ratio of the first RF power applied to the target to the first DC power applied to the target is greater than or equal to 2 and less than or equal to 4.

3. The method according to claim 2, wherein:

the first DC power applied to the target is greater than or equal to 100 W and less than or equal to 200 W;

the first RF power applied to the target is greater than or equal to 300 W and less than or equal to 600 W; and when the first process is performed, the ratio of the first RF power applied to the target to the first DC power applied to the target is 3.

4. The method according to claim 1, wherein a sum of a flow rate of the second oxidization gas and a flow rate of the first nitrogen is greater than a flow rate of the second bombardment gas and/or a sum of a flow rate of the third oxidization gas and a flow rate of the second nitrogen is greater than a flow rate of the third bombardment gas.

5. The method according to claim 1, wherein the second RF power applied to the base is less than 500 W and/or the fourth RF power applied to the base is less than 500 W.

6. The method according to claim 1, wherein:

a vacuum degree of the reaction chamber is less than $5 \times 10^{-6}$ Torr; and a temperature of the base is greater than or equal to 250° C. and less than or equal to 350° C.

7. The method according to claim 1, wherein:

a flow rate of the first bombardment gas and/or a flow rate of the second bombardment gas is less than 500 sccm;

a flow rate of the first oxidization gas and/or a flow rate of the second oxidization gas is less than 500 sccm; and the flow rate of the first bombardment gas is greater than the flow rate of the first oxidization gas and/or the flow rate of the second bombardment gas is greater than the flow rate of the second oxidization gas.

8. The method according to claim 1, wherein:

the target includes aluminum, titanium, silicon, hafnium, or tantalum target; or a compound target including aluminum, titanium, silicon, hafnium, or tantalum.

9. The method according to claim 1, wherein:

the second DC power applied to the target is less than 10000 W;

the third RF power applied to the target is less than 3000 W; and when the third process is performed, a ratio of the second DC power applied to the target to the third RF power applied to the target is greater than or equal to 2 and less than or equal to 7.

10. The method according to claim 9, wherein:

the second DC power applied to the target is greater than or equal to 3000 W and less than or equal to 6000 W;

the third RF power applied to the target is greater than or equal to 1000 W and less than or equal to 2000 W; and when the third process is performed, the ratio of the second DC power applied to the target to the third RF power applied to the target is greater than or equal to 3 and less than or equal to 6.

* * * * *